United States Patent
Wang et al.

(10) Patent No.: US 9,390,060 B2
(45) Date of Patent: Jul. 12, 2016

(54) PACKAGING METHODS, MATERIAL DISPENSING METHODS AND APPARATUSES, AND AUTOMATED MEASUREMENT SYSTEMS

(75) Inventors: Chien Rhone Wang, Hsin-Chu (TW); Chih-Wei Lai, Hsin-Chu (TW); Chih-Chiang Chang, New Taipei (TW); Kewei Zuo, Yonghe (TW); Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 465 days.

(21) Appl. No.: 13/420,383

(22) Filed: Mar. 14, 2012

(65) Prior Publication Data
US 2013/0244346 A1    Sep. 19, 2013

(51) Int. Cl.
*H01L 21/66*    (2006.01)
*G06F 17/00*    (2006.01)
(Continued)

(52) U.S. Cl.
CPC ............. *G06F 17/00* (2013.01); *H01L 22/12* (2013.01); *H01L 22/20* (2013.01); *H01L 24/94* (2013.01); *H01L 24/97* (2013.01); *H01L 25/0652* (2013.01); *H01L 2224/16145* (2013.01); *H01L 2224/16225* (2013.01); *H01L 2224/32145* (2013.01); *H01L 2224/32225* (2013.01); *H01L 2224/73204* (2013.01); *H01L 2224/83951* (2013.01); *H01L 2224/92125* (2013.01); *H01L 2224/94* (2013.01); *H01L 2224/97* (2013.01); *H01L 2225/06513* (2013.01);
(Continued)

(58) Field of Classification Search
CPC ........ H01L 22/12; H01L 21/563; H01L 22/20
USPC .......... 438/15, 16, 7, 109; 257/687, E21.527, 257/E21.529, E21.53, E23.123, E23.129; 700/109, 110, 240; 29/720
See application file for complete search history.

(56) References Cited

U.S. PATENT DOCUMENTS

| 4,811,082 A | 3/1989 | Jacobs et al. |
| 4,990,462 A | 2/1991 | Sliwa, Jr. |
| 5,075,253 A | 12/1991 | Sliwa, Jr. |

(Continued)

FOREIGN PATENT DOCUMENTS

| JP | 2011-29353 | * 2/2011 | ............. H01L 21/56 |
| JP | 2011-119590 | * 6/2011 | ............. H01L 21/56 |
| WO | WO 2012/140689 | * 10/2012 | ............. H01L 27/288 |

OTHER PUBLICATIONS

Wikipedia, "Charge-coupled device," http://en.wikipedia.org/wiki/Charge-coupled_device, Wikipedia, The Free Encyclopedia, Mar. 9, 2012, pp. 1-12.

(Continued)

*Primary Examiner* — Mary Wilczewski
(74) *Attorney, Agent, or Firm* — Slater Matsil, LLP

(57) ABSTRACT

Packaging methods, material dispensing methods and apparatuses, and automatic measurement systems are disclosed. In one embodiment, a method of packaging semiconductor devices includes coupling a second die to a top surface of a first die, dispensing a first amount of underfill material between the first die and the second die, and capturing an image of the underfill material. Based on the image captured, a second amount or no additional amount of underfill material is dispensed between the first die and the second die.

14 Claims, 6 Drawing Sheets

(51) Int. Cl.
*H01L 23/00* (2006.01)
*H01L 25/065* (2006.01)

(52) U.S. Cl.
CPC ............... *H01L 2225/06517* (2013.01); *H01L 2225/06541* (2013.01); *H01L 2924/181* (2013.01)

(56) References Cited

U.S. PATENT DOCUMENTS

| | | | |
|---|---|---|---|
| 5,380,681 A | 1/1995 | Hsu | |
| 5,481,133 A | 1/1996 | Hsu | |
| 5,864,600 A * | 1/1999 | Gray et al. | 378/57 |
| 6,002,177 A | 12/1999 | Gaynes et al. | |
| 6,023,666 A * | 2/2000 | Jiang et al. | 702/173 |
| 6,112,588 A * | 9/2000 | Cavallaro et al. | 73/149 |
| 6,117,695 A * | 9/2000 | Murphy et al. | 438/15 |
| 6,187,678 B1 | 2/2001 | Gaynes et al. | |
| 6,229,216 B1 | 5/2001 | Ma et al. | |
| 6,234,379 B1 * | 5/2001 | Donges | 228/207 |
| 6,236,115 B1 | 5/2001 | Gaynes et al. | |
| 6,255,142 B1 * | 7/2001 | Babiarz et al. | 438/126 |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,400,036 B1 * | 6/2002 | Tang et al. | 257/780 |
| 6,412,328 B1 * | 7/2002 | Cavallaro et al. | 73/1.74 |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,498,054 B1 * | 12/2002 | Chiu et al. | 438/108 |
| 6,538,750 B1 * | 3/2003 | Fishbaine et al. | 356/614 |
| 6,562,653 B1 | 5/2003 | Ma et al. | |
| 6,570,248 B1 | 5/2003 | Ahn et al. | |
| 6,590,409 B1 * | 7/2003 | Hsiung et al. | 324/754.22 |
| 6,600,222 B1 | 7/2003 | Levardo | |
| 6,607,938 B2 | 8/2003 | Kwon et al. | |
| 6,650,022 B1 * | 11/2003 | Qi et al. | 257/797 |
| 6,661,085 B2 | 12/2003 | Kellar et al. | |
| 6,762,076 B2 | 7/2004 | Kim et al. | |
| 6,790,748 B2 | 9/2004 | Kim et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,975,016 B2 | 12/2005 | Kellar et al. | |
| 7,005,316 B2 * | 2/2006 | Lee et al. | 438/106 |
| 7,009,695 B2 * | 3/2006 | Some | 356/237.1 |
| 7,037,804 B2 | 5/2006 | Kellar et al. | |
| 7,056,807 B2 | 6/2006 | Kellar et al. | |
| 7,087,538 B2 | 8/2006 | Staines et al. | |
| 7,151,009 B2 | 12/2006 | Kim et al. | |
| 7,157,787 B2 | 1/2007 | Kim et al. | |
| 7,204,960 B2 * | 4/2007 | Hui et al. | 422/82.05 |
| 7,215,033 B2 | 5/2007 | Lee et al. | |
| 7,217,595 B2 * | 5/2007 | Morrow et al. | 438/108 |
| 7,276,799 B2 | 10/2007 | Lee et al. | |
| 7,279,795 B2 | 10/2007 | Periaman et al. | |
| 7,307,005 B2 | 12/2007 | Kobrinsky et al. | |
| 7,317,256 B2 | 1/2008 | Williams et al. | |
| 7,320,928 B2 | 1/2008 | Kloster et al. | |
| 7,327,448 B2 * | 2/2008 | Klein et al. | 356/237.1 |
| 7,345,350 B2 | 3/2008 | Sinha | |
| 7,402,442 B2 | 7/2008 | Condorelli et al. | |
| 7,402,515 B2 | 7/2008 | Arana et al. | |
| 7,410,884 B2 | 8/2008 | Ramanathan et al. | |
| 7,432,592 B2 | 10/2008 | Shi et al. | |
| 7,494,845 B2 | 2/2009 | Hwang et al. | |
| 7,528,494 B2 | 5/2009 | Furukawa et al. | |
| 7,531,890 B2 | 5/2009 | Kim | |
| 7,557,597 B2 | 7/2009 | Anderson et al. | |
| 7,576,435 B2 | 8/2009 | Chao | |
| 7,622,311 B1 * | 11/2009 | Cha et al. | 438/16 |
| 7,790,499 B2 | 9/2010 | Sato et al. | 438/106 |
| 7,834,450 B2 | 11/2010 | Kang | |
| 8,269,979 B2 * | 9/2012 | Klein et al. | 356/502 |
| 8,426,246 B2 * | 4/2013 | Toh et al. | 438/108 |
| 8,518,722 B2 * | 8/2013 | Chen et al. | 438/15 |
| 8,940,557 B2 * | 1/2015 | Kim et al. | 438/15 |
| 2002/0028533 A1 * | 3/2002 | Tang et al. | 438/106 |
| 2003/0096452 A1 * | 5/2003 | Yin et al. | 438/108 |
| 2003/0194833 A1 * | 10/2003 | Quinones et al. | 438/108 |
| 2004/0175832 A1 * | 9/2004 | Hui et al. | 436/8 |
| 2004/0214370 A1 * | 10/2004 | Quinones et al. | 438/106 |
| 2005/0206017 A1 * | 9/2005 | Starkston et al. | 257/797 |
| 2006/0021438 A1 * | 2/2006 | Klein et al. | 73/623 |
| 2007/0069041 A1 * | 3/2007 | Quinones et al. | 239/71 |
| 2008/0194047 A1 * | 8/2008 | Sato et al. | 438/15 |
| 2010/0055848 A1 * | 3/2010 | Cha et al. | 438/127 |
| 2012/0052603 A1 * | 3/2012 | Chen et al. | 438/15 |
| 2012/0119354 A1 * | 5/2012 | Tsai et al. | 257/737 |
| 2012/0193779 A1 * | 8/2012 | Lee et al. | 257/737 |
| 2012/0244274 A1 * | 9/2012 | Yamabe | 427/58 |
| 2013/0200529 A1 * | 8/2013 | Lin et al. | 257/777 |
| 2013/0244346 A1 * | 9/2013 | Wang et al. | 438/7 |
| 2013/0344627 A1 * | 12/2013 | Kim et al. | 438/15 |

OTHER PUBLICATIONS

Wikipedia, "Image Sensor," http://en.wikipedia.org/wiki/Image_sensor, Wikipedia, The Free Encyclopedia, Feb. 9, 2012, pp. 1-12.

* cited by examiner

US 9,390,060 B2

PACKAGING METHODS, MATERIAL DISPENSING METHODS AND APPARATUSES, AND AUTOMATED MEASUREMENT SYSTEMS

CROSS-REFERENCE TO RELATED APPLICATIONS

This application relates to the following co-pending and commonly assigned U.S. patent application Ser. No. 13/224,575, filed on Sep. 2, 2011, entitled, "Method of Three Dimensional Integrated Circuit Assembly," and Ser. No. 13/369,126, filed on Feb. 8, 2012, entitled, "Semiconductor Device Packaging Methods and Structures Thereof," which applications are hereby incorporated herein by reference.

BACKGROUND

Semiconductor devices are used in a variety of electronic applications, such as personal computers, cell phones, digital cameras, and other electronic equipment. The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Thus, packages such as wafer level packaging (WLP) have begun to be developed, in which integrated circuits (ICs) are placed on a carrier having wiring for making connection to the ICs and other electrical components. To further increase circuit density, three-dimensional (3D) ICs have also been developed, in which two or more dies or ICs are bonded together and electrical connections are formed between the dies and contact pads on a substrate.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to the packaging of semiconductor devices and material dispensing methods for 3DICs. Novel packaging methods, underfill material dispensing methods and apparatuses, and automatic measurement systems will be described herein.

Figure 1:
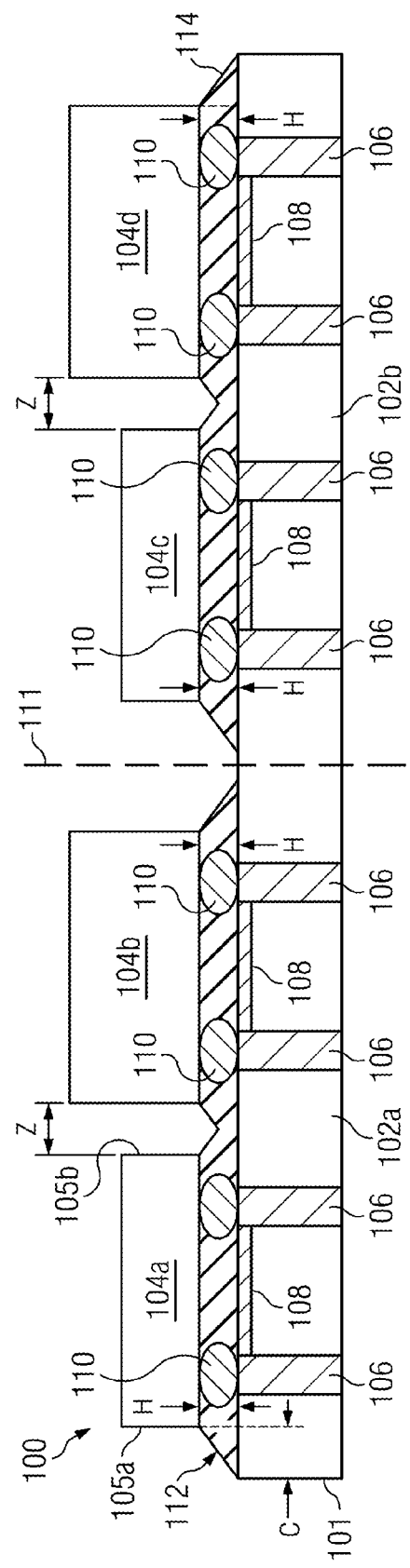
FIG. 1 is a cross-sectional view of a plurality of second dies coupled to first dies in accordance with an embodiment of the present disclosure.
Figure 3:
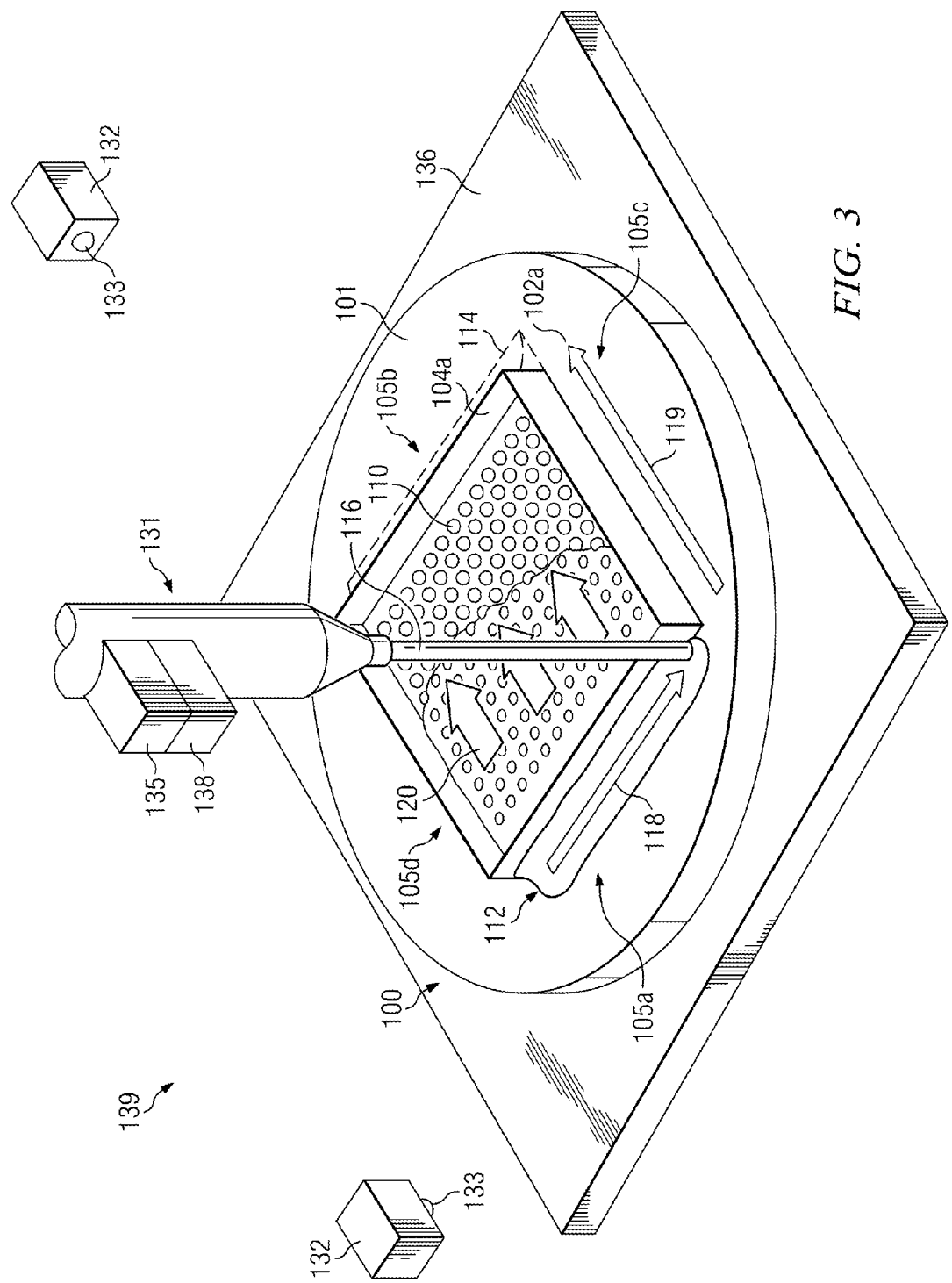
FIG. 3 is a perspective view of the underfill material being applied under a second die.

Referring first to FIG. 1, a semiconductor device 100 packaged using a 3DIC process is shown, as described in U.S. patent application Ser. No. 13/224,575 filed on Sep. 2, 2011, which is entitled, "Method of Three Dimensional Integrated Circuit Assembly," and which is incorporated herein by reference. The semiconductor device 100 includes a workpiece 101 comprising a plurality of first dies 102a and 102b. Only two first dies 102a and 102b are shown in the drawings; however, the workpiece 101 includes a plurality of the first dies 102a and 102b formed across the surface thereof. Dozens, hundreds, or other numbers of the first dies 102a and 102b may be formed on the workpiece 101, for example. The workpiece 101 is substantially circular in a top view, as shown in FIG. 3.

A plurality of second dies 104a, 104b, 104c, and 104d is coupled to the first dies 102a and 102b in a 3DIC packaging configuration. Embodiments of the present disclosure include methods of dispensing an underfill material 112 under each second die 104a, 104b, 104c, 104d coupled to the first dies 102a and 102b when packaging multiple dies together, such as dies (102a, 104a, and 104b) and dies (102b, 104c, and 104d) in FIG. 1. The methods monitor and control an amount of the underfill material 112 dispensed for the second dies 104a, 104b, 104c, and 104d such that good fillet 114 formation is achieved of the underfill material 112, voids do not form in the underfill material 112 under the dies 104a, 104b, 104c, and 104d, and bridging of the underfill material 112 between closely-spaced first dies 102a and 102b is avoided.

The first dies 102a and 102b may comprise interposers that include a workpiece 101 or substrate with a plurality of through-silicon vias (TSVs) 106 formed therein, in some embodiments. The first dies 102a and 102b may comprise three dimensional integrated circuit (3DIC) interposers that include an integrated circuit with a plurality of TSVs formed therein, in some embodiments. The first dies 102 and 102b may comprise interposer dies, for example. In the embodiments described herein, the term "die" should be interpreted broadly and expansively to cover substrates, workpieces, integrated circuit dies, interposers, and other similar integrated circuit devices and packaging devices, as examples. Only two first dies 102a and 102b are shown on the workpiece 101; however, dozens or hundreds of first dies 102a and 102b may be formed across the workpiece 101, not shown. A redistribution layer (RDL) 108 may be disposed proximate a top surface of the first dies 102a and 102b.

Bumps 110 are coupled between the first dies 102a and 102b and the second dies 104a, 104b, 104c, and 104d. The bumps 110 may be disposed over portions of the RDL 108 of the first dies 102a and 102b, for example. The bumps 110 comprise a conductive material such as solder and provide electrical and mechanical connection of the second dies 104a, 104b, 104c, and 104d to the first dies 102a and 102b.

The first dies 102a and 102b are formed on the workpiece 101 and are separated after the 3DIC packaging process at singulation or scribe lines 111 in some embodiments. The first dies 102a and 102b and the second dies 104a, 104b, 104c, and 104d may comprise semiconductor dies comprising integrated circuits, for example.

The second dies 104a, 104b, 104c, and 104d are also referred to herein as a second die 104a, a third die 104b, and a plurality of fourth dies 104c and 104d. The second dies 104a, 104b, 104c, and 104d are also referred to herein as top dies 104a, 104b, 104c, and 104d. The second dies 104a, 104b, 104c, and 104d are vertically spaced apart from the first dies 102a and 102b by a stand-off distance H. The height of the bumps 110 may vary for each second die 104a, 104b, 104c, and 104d, for example, so that distance H may be different for the second dies 104a, 104b, 104c, and 104d.

Portions of the underfill material 112 extend outwardly below the second dies 104a, 104b, 104c, and 104d. The portions of the underfill material 112 that extend outwardly from below the second dies 104a, 104b, 104c, and 104d are referred to herein as fillets 114. The fillets 114 of the underfill material 112 comprise a width C proximate a perimeter of the second dies 104a, 104b, 104c, and 104d along the edges (such as edges 105a and 105b shown for second die 104a) of the second dies 104a, 104b, 104c, and 104d.

In some embodiments, a single die 104a, 104b, 104c, or 104d may be attached to a single first die 102a or 102b. In other embodiments, two or more second dies 104a, 104b, 104c, or 104d may be attached to one first die 102a or 102b, as shown in FIG. 1. Each first die 102a and 102b may comprise an interposer for packaging a plurality of second dies 104a and 104b, and 104c and 104c, respectively. The first dies 102 and 102b may also comprise integrated circuits that include TSVs 106. The second dies 104a and 104b may be spaced apart by a die-to-die dimension Z which may comprise about 10 to 400 µm, for example, although alternatively, dimension Z may comprise other values.

Figure 2:
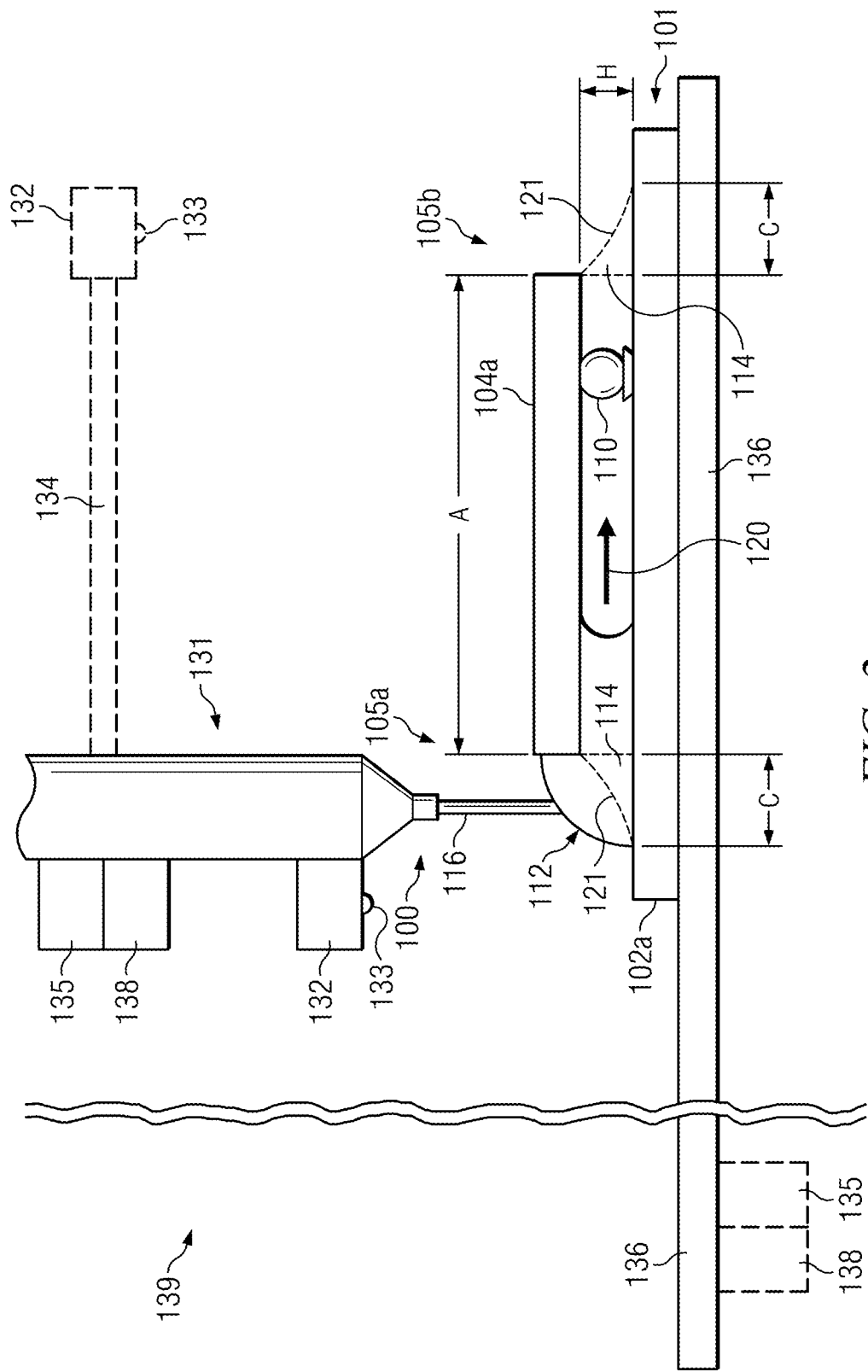
FIG. 2 is a cross-sectional view of an underfill material being applied under a second die using a material dispensing apparatus and using an automatic measurement system in accordance with an embodiment.

FIG. 2 is a cross-sectional view, and FIG. 3 is a perspective view, of an automatic measurement system 139 and an underfill material 112 being applied under a second die 104a using a dispensing apparatus 131 in accordance with embodiments. The underfill material 112 is applied using the underfill material dispensing apparatus 131 that includes a dispensing needle 116. The dispensing apparatus 131 may include or may be disposed proximate a support 136 for a workpiece 101 and may include tool control software and a reservoir for the underfill material 112 to be dispensed (not shown). Only one top die 104a is shown in FIGS. 2 and 3; however, a plurality of top dies 104a and 104b (and optionally 104c and/or 104d) may be coupled to each of the bottom dies 102a and 102b, as shown in FIG. 1. The dispensing process is performed simultaneously for the plurality of top dies 104a, 104b, 104c, and 104d disposed on each of the first dies 102a and 102b in some embodiments.

As one example, the underfill material 112 is dispensed using the dispensing needle 116 along one side of the top dies 104a and 104b disposed over the bottom die 102a. Next, the underfill material 112 is dispensed along one side of the top dies 104c and 104d disposed over the bottom die 102b. For example, dispensing the underfill material 112 along one side of top die 104a is shown at 118 in FIG. 3. Alternatively, the underfill material 112 may be disposed along two adjacent sides of the top dies 104a and 104b disposed over the bottom die 102a in an L-shape, as shown at 118 and 119, which show the movement of the needle 116 during the dispensing process of the underfill material 112. The underfill material 112 is applied along one or more sides of the second die 104a, and may be applied in a U-shape along three sides in some embodiments, for example, not shown in the drawings. The underfill material 112 may be applied in one or more passes of the dispensing needle 116.

The needle 116 may comprise a diameter of about 1 to 2 mm, for example. The underfill material 112 is a liquid when applied that flows (see the flow direction 120 in FIG. 2) beneath the second die 104a (and also second die 104b, not shown), between the bumps 110 along a width A of the second die 104a from a first edge 105a to a second edge 105b opposite the first edge 105a. The liquid underfill material 112 flows under the second dies 104a and 104b due to capillary action, for example. The underfill material 112 may comprise epoxy or a polymer, although other materials may alternatively be used. The underfill material 112 comprises a solid when hardened, after curing. The underfill material 112 may be heated by placing the workpiece 101 in an oven to evaporate the liquid and cure the underfill material 112, for example. When the underfill material 112 is being applied, the underfill material 112 has a beaded, rounded, or convex shape, as shown at the left edge 105a in FIG. 2. After the underfill material 112 flows under the top die 104a, the fillets 114 are formed proximate the edges 105a, 105b, 105c, and 105d (see FIG. 3) of the second die 104a due to a meniscus effect of the liquid during and after the dispensing and curing processes of the underfill material 112. The fillets 114 may have a concave shape on a top surface thereof before and/or after curing, for example, as shown in phantom in FIG. 2 at 121.

In accordance with embodiments of the present disclosure, an automatic measurement system 139 is used to ensure that an optimum amount of the underfill material 112 is dispensed for each of the first dies 102a and 102b and each of the second dies 104a, 104b, 104c, and 104d. The automatic measurement system 139 includes a processor 138, memory 135, and a camera 132. The camera 132 is adapted to capture an image of the underfill material 112 dispensed between a second die 104a, 104b, 104c, and 104d and a first die 102a or 102b, e.g., to capture an image of the fillet 114 formed at the edges 105a, 105b, 105c, and 105d. The memory 135 is adapted to store software and a value for an amount of the underfill material 112 to dispense beneath a semiconductor die such as a second die 104a, 104b, 104c, and 104d. The processor 138 is adapted to receive the image from the camera 132, analyze the image to determine a measurement of a fillet 114 width of the underfill material 112 dispensed, compare the measured fillet 114 width to the stored value for the amount of the underfill material 112 to dispense in the memory 135, and instruct the dispensing apparatus 116 to continue or discontinue dispensing the underfill material 112.

The automatic measurement system 139 may comprise an independent, separate system that is coupled to an underfill material dispensing apparatus 131. The independent automatic measurement system 139 is adapted to capture and process images taken using the camera 132 and signal the underfill material dispensing apparatus 131 to continue or stop the dispensing process.

Alternatively, in other embodiments, the automatic measurement system 139 may be integral to the underfill material dispensing apparatus 131 in some embodiments. For example, the underfill material dispensing apparatus 131 may include a built-in automatic measurement system 139. The dispensing apparatus 131 with the built-in automatic measurement system 139 may be adapted to stop the dispensing process when the as-dispensed fillet 114 width reaches a set target width for the fillet 114 in some embodiments. Alternatively, in other embodiments, the dispensing apparatus 131 with the built-in automatic measurement system 139 may be adapted to stop the dispensing process when the system 139 detects a particular a fillet 114 width, after which the system 139 continues to dispense a specific, predetermined amount of underfill material 112 to meet the desired fillet 114 width, as another example, e.g., based on threshold levels that have been set for fillet 114 width measurement.

The camera 132 includes a lens 133 that is adapted to capture an image of the second die 104a, a portion of the second die 104a, and/or at least a portion of the fillet 114 of the underfill material 112 proximate an edge 105a, 105b, 105c, or 105d or a corner of the second die 104a. The camera 132 comprises a charge-coupled device (CCD) image sensor, a complementary metal oxide semiconductor (CMOS) image sensor (CIS), or a combination thereof, such as a hybrid CCD/CMOS architecture device, "sCMOS", in some embodiments. The camera 132 may also comprise or other types of image capture devices. The pixel size of the CCD image sensor or type of other image sensor may comprise about 11.4 µm in some embodiments, although alternatively, the pixel size may comprise other values. The camera 132 is disposed proximate the dispensing needle 116 in some embodiments. The camera 132 may be mechanically coupled to the dispensing needle 116 or to the support 136, for example. Two or more cameras 132 may be implemented in the automatic measurement system 139 and may be coupled to the dispensing needle 116 and/or the support 136 in various locations or elsewhere in the system 139 or proximate the system 139.

In some embodiments, one end of an optional mechanical arm 134 may be coupled to the dispensing needle 116, as shown in phantom in FIG. 2. The camera 132 may be coupled to the other end of the mechanical arm 134, also shown in phantom. The mechanical arm 134 may be adjustable so the camera 132 may be moved and positioned in a desired location for capturing images and taking measurements of the fillet 114 of underfill material 112 for each of the second dies 104a, 104b, 104c, and 104d disposed over the workpiece 101. The mechanical arm 134 may be moveable using robotics and may be controlled using the processor 138 of the automatic measurement system 139 or a tool control software for the dispensing system 131, for example.

The desired fillet 114 width C and an estimated amount of the underfill material 112 needed to achieve the desired fillet 114 width C are determined and entered into the automatic measurement system 139 (e.g., into the memory 135). The system 139 includes an operator interface such as a keyboard (not shown in the drawings) for entering the values for the desired fillet 114 width C and the estimated amount of the underfill material 112. The memory 135 also includes stored software or an algorithm that is adapted to perform calculations and feedback controls for measuring and dispensing the underfill material 112.

At least a portion of the estimated amount of underfill material 112 is dispensed, e.g., along a first edge 105a of a second die 104a, as shown in FIGS. 2 and 3, and optionally also along a second edge 105c (or more edges, not shown), as shown in FIG. 3. During the dispensing process for the second die 104a, the dispensing process is paused, and the camera 132 of the automatic measurement system 139 is used to capture an image of the first die 102a in-situ during the dispensing process for each first die 102a and 102b. For example, an image of the edge 105b opposite the edge 105a that the underfill material 112 is dispensed along may be captured. Alternatively, an image of an edge 105c or 105d adjacent the edge 105a that the underfill material 112 is dispensed along may be captured. Images of other portions of the first dies 102a and 102b may be captured alternatively in accordance with embodiments. If the underfill material 112 is dispensed along a first edge 105a and a second edge 105c, an image of a corner between edges 105b and 105d may be captured to ascertain if the fillet 114 has been formed to the correct size or has almost been formed at the corner, for example.

After the image has been captured by the camera 132, the image is then measured by the automatic measurement system 139 and compared to the desired fillet 114 width C. If the desired fillet 114 width C has been reached, no additional underfill material 112 is dispensed for that particular first die 102a and second die 104a (or first die 102 and second dies 104a and 104b), and the dispensing apparatus 131 is moved to another first die 102b, where the process is repeated to dispense the appropriate amount of underfill material 112. If the desired fillet 114 width C has not yet been reached, then the dispensing of the underfill material 112 is continued for the first die 102a for a predetermined amount of time or amount of material of the underfill material 112, and then the dispensing process for the first die 102a is paused again, and another image is captured by the camera 132 and analyzed by the automatic measurement system 139. The process is repeated for each first die 102a and 102b until the desired fillet 114 width C of the underfill material 112 is achieved for all first dies 102a and 102b of the workpiece 101. The underfill material 112 is then cured.

The automatic measurement system 139 is adapted to receive and analyze a picture image file from the built-in or installed camera 132 comprising the image sensor in order to measure the as-dispensed fillet 114 width at the moment that the picture is taken. The automatic measurement system 139 is adapted to signal a tool control software of the dispensing apparatus 131 to stop the dispensing process. The automatic measurement system 139 may be implemented in a software component in some embodiments, e.g., in the tool control software of the dispensing apparatus 131. A correlation model between the as-dispensed fillet 114 width and cured fillet 114 width may be used to dispense the appropriate amount of underfill material 112. The tool control software of the dispensing apparatus 131 is adapted to receive a stop signal from a fillet 114 width measurement component and pause and/or stop the dispensing process of the underfill material 112.

In some embodiments of the present disclosure, a correlation model is established between an as-dispensed fillet 114 width and a cured fillet 114 width, to account for shrinkage of the underfill material 112 after curing. The automatic measurement system 139 uses a CCD image sensor (or other type of image sensor) camera 132 to capture the images and control the fillet 114 widths real-time and in-situ. The camera 132 is built-in or installed to monitor the as-dispensed fillet width 114 in real time to control the fillet 114 width dispensed for each top die 104a, 104b, 104c, and 104d disposed over a workpiece 101.

Figure 4:
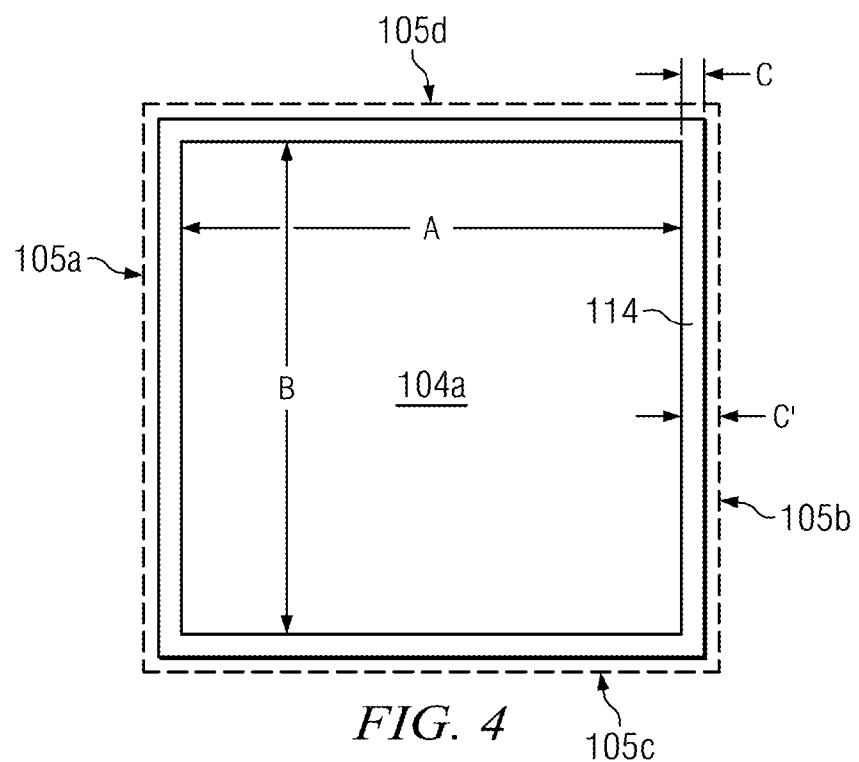
FIG. 4 shows a top view of a second die and a fillet of the underfill material formed proximate edges of the second die.

FIG. 4 shows a top view of one of the second dies 104a after the underfill material 112 is disposed beneath the second die 104a in accordance with embodiments of the present disclosure. The fillet 114 of underfill material 112 is disposed along the edges 105a, 105b, 105c, and 105d of the second die 104a. The camera 132 of the automatic measurement system 139 may be used to capture an image of a fillet 114 on any of the edges 105a, 105b, 105c, and 105d or other portions of the first die 102a and/or second die 104a periodically in the dispensing process for the underfill material 112. The second die 104a includes a width A and a length B. The width A and the length B of the second dies 104a, 104b, 104c, and 104d may comprise about 7 to 30 mm in some embodiments, for example, although alternatively, the width A and the length B of the second dies 104a, 104b, 104c, and 104d may comprise other values.

The fillet 114 has a width C which is the desired width for the fillet 114 of underfill material 112. The desired fillet 114 width C may be determined based on wafer warpage (for example, warpage of the workpiece 101). The smaller the warpage, the smaller width C will be, in some embodiments, for example. The desired fillet 114 width C may comprise about 100 to 300 µm in some embodiments, as an example. The desired fillet 114 width C may comprise about 150 µm in some embodiments, as another example. Alternatively, the fillet 114 width C may comprise other values.

Shrinkage of the underfill material 112 may be taken into consideration when determining the desired fillet 114 width C in some embodiments. For example, the underfill material 112 may shrink when cured, resulting in a smaller fillet 114 width than measured during the dispensing process by the automatic measurement system 139. The desired fillet 114 width C to be measured may be increased to a width C' shown in FIG. 4, to account for the shrinkage of the underfill material 112 to achieve a desired final fillet 114 width C after curing. The fillet 114 width C' before curing may comprise about 30% or less larger than the desired fillet 114 width C, for example, although alternatively, the fillet 114 width C' may comprise other dimensions.

The amount of underfill material 112 required to be dispensed to achieve the desired fillet 114 width C may comprise about 80 to 300 mg of material, as an example. Alternatively, the amount of underfill material 112 dispensed may comprise other amounts, depending on the sizes of the second dies 104a, 104b, 104c, or 104d, the stand-off height H, and other factors and variables.

Advantageously, the width C of the fillet 114 is well-controlled using the automatic measurement system 139. By periodically capturing the image of the fillet 114 during the dispensing process, dispensing too much and dispensing too little of the underfill material 112 is avoided. Furthermore, before the dispensing process is stopped for a first die 102a, the camera 132 of the automatic measurement system 139 is used to ensure that a sufficient amount of the underfill material 112 has been dispensed to achieve the desired fillet 114 width C (or C') for each second die 104a, 104b, 104c, and 104d attached to the first dies 102a and 102b on the workpiece 101.

Figure 5:
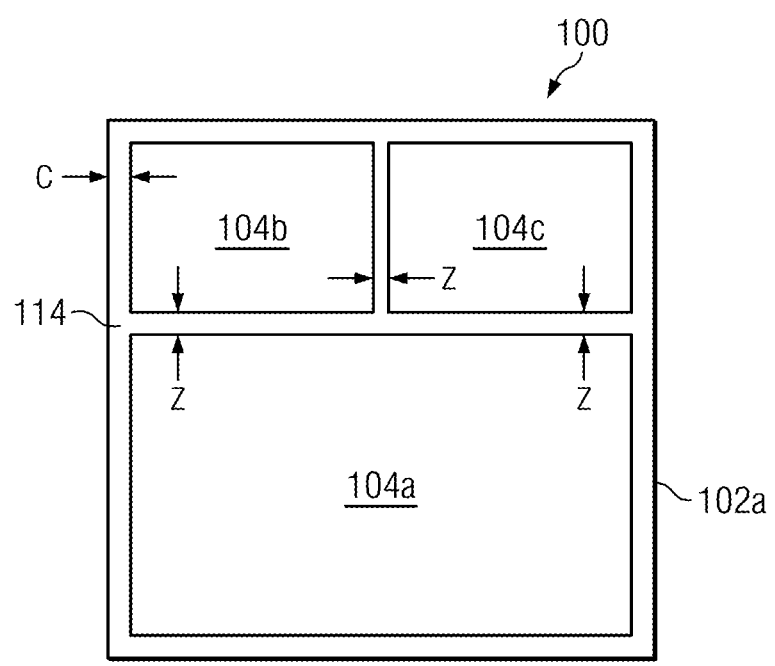
FIG. 5 is a top view of a plurality of second dies attached to a first die in accordance with an embodiment.

FIG. 5 is a top view of a plurality of second dies 104a, 104b, and 104c attached to a first die 102a or 102b in accordance with an embodiment. Larger second die 104a may comprise a central processing unit (CPU) and smaller second dies 104b and 104c may comprise memory devices such as dynamic random access memory (DRAM) devices, as an example. Alternatively, the second dies 104a, 104b, and 104c may comprise other types of devices, depending on the application. The second dies 104b and 104c, 104a and 104b, and 104a and 104c may be spaced apart by die-to-die dimension Z, which may be different or about the same between the dies 104a, 104b, and 104c, for example. A fillet 114 of the underfill material 112 resides between the second dies 104b and 104c, 104a and 104b, and 104a and 104c and proximate edges of the perimeters of the second dies 104a, 104b, and 104c. The fillet 114 comprises a desired width C which is achieved using the novel automatic measurement systems 139, dispensing apparatuses 131, and packaging methods described herein.

Figure 6:
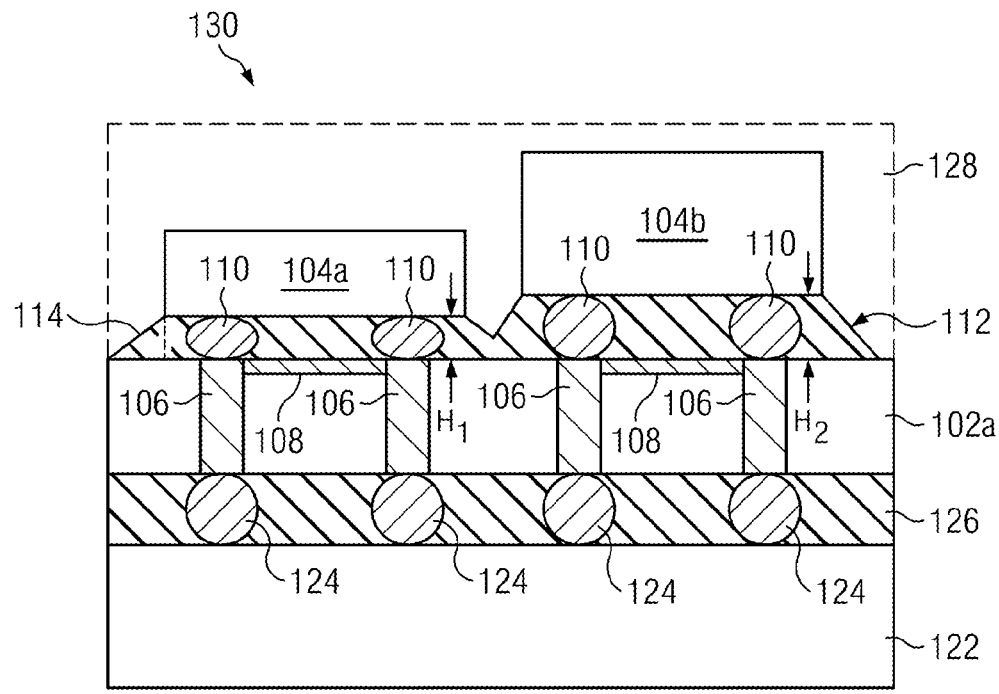
FIG. 6 is a cross-sectional view of a packaged semiconductor device including a plurality of second dies coupled to a first die, wherein the underfill material for the plurality of second dies is dispensed using a method described herein.

FIG. 6 is a cross-sectional view of a packaged semiconductor device 130 including a plurality of second dies 104a and 104b coupled to a first die 102a after the completion of the packaging process and singulation of the first dies 102a. The first die 102a may be coupled to a substrate 122 by a plurality of bumps 124, and an underfill material 126 comprising a second underfill material may be disposed between the first die 102a and the substrate 122, as described in U.S. patent application Ser. No. 13/224,575, which is incorporated herein by reference. The substrate 122 is coupled to the bottom surface of the first die 102a. An optional molding compound 128 may be formed over the second dies 104a and 104b and the underfill material 112, as shown in phantom in FIG. 6. The molding compound 128 may be disposed over the first die 102a (e.g., over the fillets 114 of the underfill material 112) and over the second dies 104a and 104b, as shown.

FIG. 6 illustrates that the distances $H_1$ and $H_2$ between the second dies 104a and 104b and the first die 102a may vary for each second die 104a and 104b. In accordance with embodiments of the present disclosure, a greater amount or volume of underfill material 112 is dispensed under second dies 104a or 104b having a greater distance $H_1$ or $H_2$. For example, in FIG. 6, die 102a comprises a first die 102a. Dies 104a and 104b are also referred to herein as a second die 104a and a third die 104b coupled to the top surface of the first die 102a. The underfill material 112 is disposed between the first die 102a and the second die 104a, and between the first die 102a and the third die 104b.

A plurality of fourth dies (not shown in FIG. 6; see FIG. 1 at 104c and 104d) may also be coupled to the top surface of the first die 102a, and the underfill material 112 may also be disposed between the first die 102a and the plurality of fourth dies 104c and 104d. The volume of the underfill material 112 beneath the second die 104a, the third die 104b, and the plurality of fourth dies 104c and 104d varies as a function of the distances $H_1$ and $H_2$ between the first die 102a and the second die 104a, the third die 104b, and the plurality of fourth dies 104c and 104d, in some embodiments, for example. The automatic measurement system 139 is used to dispense an optimum amount of underfill material 112 to obtain an optimum fillet 114 width, by monitoring the fillet 114 width.

Figure 7:
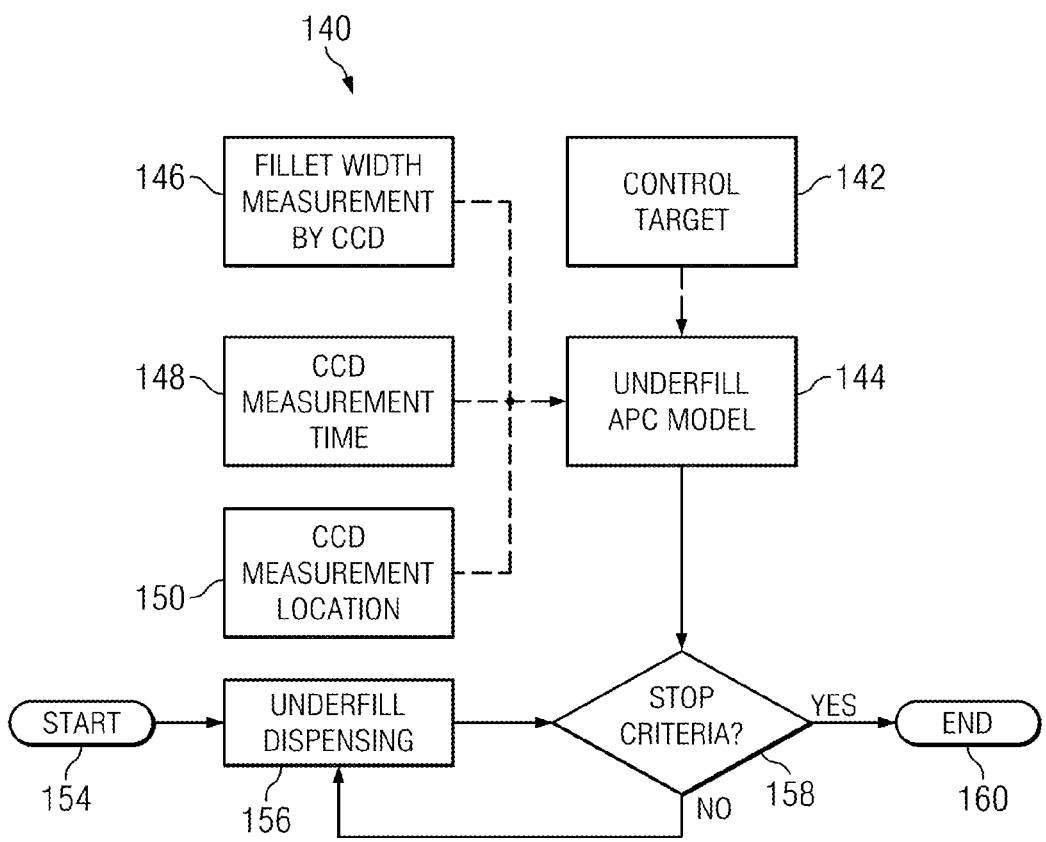
FIGS. 7 and 8 are flow charts illustrating automatic measurement methods for dispensing underfill materials for semiconductor devices in accordance with embodiments of the present disclosure.

FIG. 7 is a flow chart 140 illustrating a method of packaging semiconductor devices 102a, 102b, 104a, 104b, 104c, and/or 104d in accordance with an embodiment of the present disclosure. First, a control target is established (step 142). The control target may comprise the desired fillet 114 width C for the second dies 104a, 104b, 104c, and/or 104d after the underfill material 112 is cured. A fillet 114 width measurement by a camera 132 comprising an image sensor (CCD) is made of a test run device, e.g., in a trial run (step 146), and the camera 132 measurement time (e.g., the amount of time or material dispensed during the dispensing process, after which the dispensing process will be paused and the image will be captured using the camera 132) and the location for the camera 132 for the measurement for capturing the image of the underfill material 112 are determined (steps 148 and 150). The results of steps 142, 146, 148, and 150 are input to the processor 138 which establishes or determines an underfill material 112 advanced processing control (APC) model (step 144). The APC model establishes stop criterion for the dispensing process. The APC model may be adapted to perform a conversion between the fillet 114 width C' before curing and the fillet 114 width C after curing, for example.

The second dies 104a, 104b, 104c, and/or 104d are coupled to the first dies 102a and/or 102b, and the dispensing of the underfill material 112 is started (step 154). The underfill material 112 is then dispensed sequentially for each first die 102a and/or 102b one at a time (step 156). At a predetermined time interval or a predetermined amount of underfill material 112 dispensed during the dispensing process for each first die 102a and/or 102b the dispensing process is paused and an image is captured of the first die 102a and/or 102b. The captured image is measured and analyzed by the processor 138.

If the stop criterion has been reached (step 158), the dispensing process of the underfill material 112 for the particular first die 102a and/or 102b is stopped (step 160). The stop criterion may comprise a comparison of the desired fillet 114 width C (or C') to the measurement of the captured image of the fillet 114 width of the second die 104a, 104b, 104c, and/or 104d, for example. The predicted cured fillet 114 width C is compared to the control target of step 142 in some embodiments, for example. After the dispensing process is stopped for a particular first die 102a and/or 102b, the dispensing needle 116 is moved to another first die 102a and/or 102b where steps 154, 156, 158, and 160 are repeated.

If the stop criterion has not been reached (step 158), then the dispensing of the underfill material 112 (step 156) is continued for a predetermined period of time or amount of underfill material 112, and then another image is captured and step 158 is repeated. Steps 156 and 158 are repeated until the stop criterion has been reached (step 160). Steps 154, 156, 158, and 160 are repeated until the underfill material 112 has been dispensed for all of the first dies 102a and 102b and second dies 104a, 104b, 104c, and/or 104d on the workpiece 101.

Figure 8:
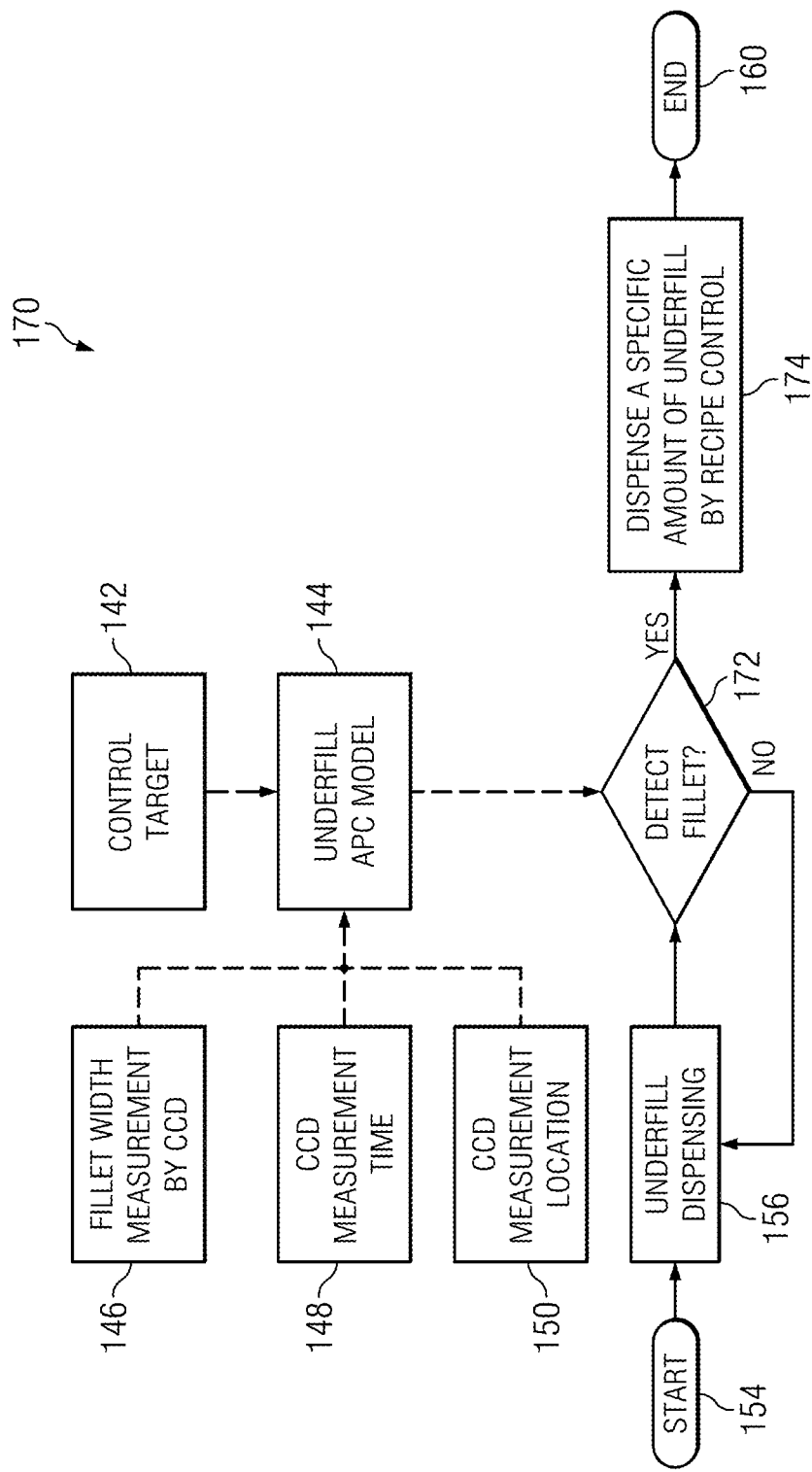

FIG. 8 illustrates a flow chart 170 in accordance with another embodiment. Steps 142 through 156, and 160 are the same as described for FIG. 7. After the underfill material 112 has been dispensed for a predetermined time period or amount of underfill material 112, an image of the fillet 112 formed on the second dies 104a, 104b, 104c, and/or 104d is captured by the camera 132 (step 172) and compared to a predetermined threshold level or levels. If a fillet 114 is not detected in step 172, the underfill material 112 is continued to be dispensed (step 156). However, if a fillet 114 is detected, the fillet 114 width detected is compared to the predetermined level or levels, and then a specific amount of underfill material 112 (corresponding to and proportional to the predetermined level or levels) determined by a recipe control is dispensed (step 174), and the dispensing process is stopped (step 160) for that particular first die 102a and/or 102b. Steps 154, 156, 158, and 160 are repeated until the underfill material 112 has been dispensed for all of the first dies 102a and 102b and second dies 104a, 104b, 104c, and/or 104d on the workpiece 101.

In some embodiments, the in-situ sensor images taken by the camera 132 provide feedback to the system 139. The camera 132 is used to take pictures or capture images at a predetermined time after dispensing the underfill material 112 for a predetermined number of passes, e.g., along an edge 105a of a top die 104a. The feedback features also include specifying locations for the camera 132 to take the pictures, and measurements of the pictures or images taken using the above settings. When the measurements are greater than, equal to, or less than predetermined values, then the dispensing of the underfill material 112 is either stopped or a predetermined amount of the underfill material 112 may be dispensed. The additional amount to be dispensed may comprise a set, fixed amount, or may vary depending on the threshold levels established.

As one example of a method of dispensing the underfill material 112 using the automatic measurement system 139, the desired fillet 114 width C may comprise 150 μm. The control target is set to stop dispensing the underfill material 112 for each bottom die 102a and 102b when the camera 132 comprising an image sensor measurement is greater than or equal to 150 μm. An image of the fillet 114 for a bottom die 102a in a location X:1 and Y:1 of the workpiece 101 is captured for the bottom die 102a after a predetermined number of passes of the dispensing needle 116 and/or dispensing time, e.g., 6 passes and/or 5 minutes. If the image captured is measured to be greater than or equal to about 150 μm, the dispensing process is stopped for that bottom die 102a, and the dispensing needle 116 is moved to another location of the workpiece 101 to begin the dispensing process for another bottom die 102b.

As another example of a method of dispensing the underfill material 112 using the automatic measurement system 139, the desired fillet 114 width C may comprise 100 μm. The algorithm may comprise dispensing 1 mg, 0.3 mg, or 0 mg of the underfill material 112 using three criteria or threshold levels, according to the measurement results from the images captured by the camera 132. Other numbers of criteria or threshold levels may alternatively be used. An image of the fillet 114 for a die 104a in location X:1 and Y:1 of the workpiece 101 is captured for a bottom die 102a after a predetermined number of passes of the dispensing needle 116 and/or dispensing time, e.g., 6 passes and/or 5 minutes. The three criteria may comprise: 1) if the fillet 114 width C is measured to be greater than or equal to 0 μm and less than 50 μm, 1 mg of the underfill material 112 is further dispensed; 2) if the fillet 114 width C is measured to be greater than or equal to 50 μm and less than 100 μm, 0.3 mg of the underfill material 112 is further dispensed; and 3) if the fillet 114 width C is measured to be greater than or equal to 100 μm, no additional underfill material 112 is dispensed. Alternatively, other criteria and threshold levels may be used.

As another example of a method of dispensing the underfill material 112 using the automatic measurement system 139, the desired fillet 114 width C may comprise 200 μm. The algorithm may comprise dispensing x mg of the underfill material 112 using a mathematical model or threshold levels, according to the measurement results from the images captured by the camera 132. Other mathematical models or threshold levels may alternatively be used. An image of the fillet 114 for a bottom die 102a in location X:1 and Y:1 of the workpiece 101 is captured for a top die 104a after a predetermined number of passes of the dispensing needle 116 and/or dispensing time, e.g., 6 passes and/or 5 minutes. The mathematical model may comprise x=(C−the fillet 114 width measured)/slope, wherein x is the weight (in mg) of the underfill material 112 needed to be dispensed, C is the desired fillet 114 width C, and the slope is a predetermined number describing the additional fillet width caused by the additional 1 mg of dispensed underfill material 112. If the fillet width C is measured to be greater than or equal to 200 μm, no additional underfill material 112 is dispensed. Alternatively, other mathematical models and threshold levels may be used.

In other words, in some embodiments, a plurality of threshold levels for fillet 114 width C measured is established, and a second amount of underfill material 112 to dispense for each of the plurality of threshold levels is determined. The image captured of the underfill material 112 is analyzed to determine an amount of fillet 114 width measured, and which one of the plurality of threshold levels the amount of fillet 114 width measured has attained is determined; e.g., which threshold level the measured fillet 114 width falls into is determined. The second amount of underfill material 112 for the particular threshold level the fillet 114 width measured has attained is then dispensed for the bottom die 102a.

In accordance with some embodiments of the present disclosure, after the second dies 104a, 104b, 104c, and 104d are attached to the first dies 102a and 102b, the distance H may be determined for each second die 104a, 104b, 104c, and 104d, and an amount of underfill material 112 to dispense for each second die 104a, 104b, 104c, and 104d may be determined, based on the distance H for each second die 104a, 104b, 104c, and 104d measured and other variables, as described in Ser. No. 13/369,126, filed on Feb. 8, 2012, entitled, "Semiconductor Device Packaging Methods and Structures Thereof," which is incorporated herein by reference. The stand-off height or distance H between the first dies 102a and 102b and the second dies 104a, 104b, 104c, and 104d may be used to determine an amount of underfill material 112 to dispense in some embodiments, for example. The stand-off height H may be measured of each of the second dies 104a, 104b, 104c, and 104d from the first dies 102a and 102b, and a volume of the underfill material 112 may be calculated for each of the second dies 104a, 104b, 104c, and 104d based on the stand-off height H measured, using the equations described in the related patent application Ser. No. 13/369,126. The methods to be described herein of dispensing, monitoring, and controlling the amount of underfill material 112 may be used in conjunction with the methods described in the related application Ser. No. 13/369,126, for example.

Embodiments of the present disclosure include methods of packaging semiconductor devices. Embodiments also include methods of dispensing underfill material 112 between a first die 102a or 102b and a plurality of second dies 104a, 104b, 104c, and 104d of a 3DIC. Embodiments also include automatic measurement systems 139 and underfill material dispensing apparatuses 131 described herein.

Advantages of embodiments of the disclosure include providing novel packaging techniques wherein an appropriate amount of underfill material 112 is applied for each bottom die 102a and 102b and top die 104a, 104b, 104c, and 104d of a 3DIC. The dispensing methods result in an optimum amount of underfill material 112 being dispensed for each bottom die 102 and 102b and top die 104a, 104b, 104c, and 104d such that a good fillet 114 formation is achieved for each bottom die 102a an 102b and top die 104a, 104b, 104c, and 104d. Advantageously, the optimum amount of underfill material 112 dispensed for each bottom die 102a and 102b and top die 104a, 104b, 104c, and 104d results in the prevention of or a reduction in void formation in the underfill material 112 under the dies 104a, 104b, 104c, and 104d, and also results in the prevention of or a reduction in bridging of the underfill material 112 between closely-spaced bottom dies 102a and 102b, which further results in a reduction in stress of the packaged semiconductor devices 130 and increased yields.

Variations in top die 104a, 104b, 104c, and/or 104d size and bump 110 height differences are accommodated for in dispensing the underfill material 112, resulting in improved fillet 114 profiles, widths, and heights. The methods described herein result in reduced warpage and void issues of packaged semiconductor devices 130, e.g., after curing. The methods described herein provide well-controlled dispensing and measurement methods of underfill material 112, resulting in improved process windows. The novel methods of dispensing and measuring the underfill material 112 for 3DICs are easily implementable in packaging process flows.

The present disclosure comprises a novel fillet 114 control methodology for wafer level underfill material 112 dispensing by in-situ monitoring using a camera comprising an image sensor. The fillet 114 widths can be precisely controlled and defects such as fillet 114 bridging and underfill voids can be minimized, and yields can be significantly improved. The fully automatic fillet 114 control methods described herein eliminate the need for manual handling during the underfill material 112 dispensing process, reducing man-power costs and increasing throughput. Because the fillets 114 are precisely small and are just large enough for the particular application, the design of scribe lines or a distance between the first dies 102a and 102b on the bottom wafers (e.g., the workpiece 101) can be significantly shrunken: hence, more first dies 102a and 102b may be formed on a workpiece 101, resulting in reduced processing costs per die. The fillet 114 can be precisely controlled for any given expected fillet width C.

In accordance with one embodiment of the present disclosure, a method of packaging semiconductor devices includes coupling a second die to a top surface of a first die, dispensing a first amount of underfill material between the first die and the second die, and capturing an image of the underfill material. Based on the image captured, a second amount or no additional amount of underfill material is dispensed between the first die and the second die.

In accordance with another embodiment, a method of dispensing an underfill material between a first die and a plurality of second dies of a 3DIC includes determining a desired fillet width of the underfill material, providing a workpiece including a plurality of the first dies, and providing the plurality of second dies. The method includes coupling the plurality of second dies to the plurality of first dies, and dispensing a first amount of the underfill material beneath the plurality of second dies. An image of the underfill material is captured, and based on the image captured, a second amount or no additional amount of the underfill material is dispensed beneath the plurality of second dies. The method includes repeating dispensing the first amount of the underfill material, capturing the image of the underfill material, and based on the image captured, dispensing the second amount or no additional amount of the underfill material, for each of the remainder of plurality of first dies.

In accordance with yet another embodiment, an automatic measurement system for a dispensing apparatus includes memory adapted to store software and a value for an amount of an underfill material to dispense beneath a semiconductor die, and a camera proximate the dispensing apparatus. The camera is adapted to capture an image of the underfill material. The system includes a processor adapted to receive the image from the camera, analyze the image to determine a measurement of a fillet width of the underfill material dispensed, compare the measured fillet width to the stored value for the amount of underfill material to dispense, and instruct the dispensing apparatus to continue or discontinue dispensing the underfill material.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of packaging semiconductor devices, the method comprising:
coupling a second die to a top surface of a first die;
dispensing a first amount of underfill material between the first die and the second die, the first die and the second die being at a location on a support in a dispensing system during the dispensing the first amount;
capturing an image of the underfill material in-situ at the location on the support in the dispensing system after the first amount of underfill material has been dispensed and during a break in the dispensing of the underfill material;
determining a fillet width using the image;
establishing a plurality of threshold levels for the fillet width measured;
determining a second amount of underfill material to dispense for each of the plurality of threshold levels;
analyzing the image captured of the underfill material to determine an amount of fillet width measured;
determining which of the plurality of threshold levels the amount of fillet width measured has attained; and
based on the image, dispensing the second amount of underfill material for the threshold level the fillet width measured has attained between the first die and the second die.

2. The method according to claim 1, wherein dispensing the first amount or the second amount of underfill material comprises dispensing the first amount or the second amount of underfill material along at least one side of the first die and the second die.

3. The method according to claim 1, wherein dispensing the first amount or the second amount of underfill material comprises using a dispensing needle.

4. The method according to claim 1, further comprising coupling a plurality of second dies to the top surface of the first die, dispensing a first amount of underfill material between the first die and the plurality of second dies, capturing an image of the underfill material between the plurality of second dies and the first die, and dispensing a second amount or no additional amount of underfill material between the first die and the plurality of second dies, based on the image captured.

5. The method according to claim 1, wherein the first die comprises a three dimensional integrated circuit (3DIC) interposer that includes an integrated circuit with a plurality of through silicon vias (TSVs) formed therein.

6. The method according to claim 5, wherein the 3DIC interposer includes a redistribution layer (RDL) proximate a top surface thereof and a plurality of bumps disposed over portions of the RDL, and wherein coupling the second die to the top surface of the first die comprises attaching the second die to the plurality of bumps of the 3DIC interposer.

7. A method comprising:
determining a desired fillet width of an underfill material;
coupling at least two second dies to each of first dies, the first dies being in a workpiece;
(a) dispensing a first amount of the underfill material beneath the at least two second dies coupled to one of the first dies;
(b) pausing the dispensing of the underfill material after the dispensing the first amount of the underfill material;
(c) capturing an image of the underfill material in-situ after the pausing the dispensing of the underfill material, wherein capturing the image of the underfill material comprises capturing an image of a fillet of the underfill material;
(d) comparing the image of the fillet of the underfill material to the desired fillet width;
(e) based on the image, dispensing a second amount of the underfill material beneath the at least two second dies coupled to the one of the first dies;
(f) capturing an additional image of the fillet, and dispensing an additional amount of the underfill material until the desired fillet width of the underfill material is substantially achieved; and
repeating the steps (a), (b), (c), (d), (e), and (f) for each of a remainder of the first dies.

8. The method according to claim 7, wherein determining the desired fillet width of the underfill material comprises:
measuring a stand-off height of each of the second dies from the first dies; and
calculating a volume of the underfill material for each of the second dies based on the stand-off height measured.

9. The method according to claim 7, wherein capturing the image of the underfill material comprises capturing a first image of the underfill material, further comprising, after dispensing the second amount of the underfill material:
capturing a second image of the underfill material; and
dispensing a third amount or no additional amount of the underfill material beneath the second dies based on the second image captured.

10. The method according to claim 7, wherein determining the desired fillet width comprises establishing a control target, further comprising measuring a fillet width of a test run device, determining a measurement time for capturing the image of the underfill material, determining a measurement location for capturing the image of the underfill material, and establishing an underfill advanced process control (APC) model based on the control target established, the fillet width of the test run device measured, the measurement time determined, and the measurement location determined.

11. A method comprising:
coupling a second die to a top surface of a first die;
dispensing a first amount of underfill material between the first die and the second die;
capturing an image of the underfill material; and
dispensing a second amount of underfill material between the first die and the second die based on the image, the second amount of underfill being determined by a correlation between a detected uncured underfill fillet around the second die in the image and a desired cured underfill fillet around the second die, wherein determining the second amount of underfill material includes:
establishing a plurality of threshold levels corresponding to a plurality of measured uncured fillet widths;
determining a plurality of amounts of underfill material to dispense corresponding to the plurality of threshold levels;

analyzing the image to determine a detected underfill fillet width of the detected uncured underfill fillet;

determining one of the plurality of threshold levels the detected underfill fillet width has attained; and determining one of the plurality of amounts of underfill material that corresponds to the one of the plurality of threshold levels, the one of the plurality of amounts of underfill material being dispensed as the second amount of underfill material.

12. The method according to claim 11, wherein dispensing the first amount or the second amount of underfill material comprises dispensing the first amount or the second amount of underfill material along at least one side of the first die and the second die.

13. The method according to claim 11, wherein dispensing the first amount or the second amount of underfill material comprises using a dispensing needle.

14. The method according to claim 11, wherein the dispensing the first amount of underfill material is performed while the first die and the second die are at a location on a support in a dispensing system, and wherein the capturing the image of the underfill material is performed while the first die and the second die are at the location on the support in the dispensing system.

* * * * *